(12) United States Patent
Swanson

(10) Patent No.: US 8,804,441 B1
(45) Date of Patent: *Aug. 12, 2014

(54) METHODS AND SYSTEMS FOR DETECTING AND CORRECTING TIMING SIGNAL DRIFT IN MEMORY SYSTEMS

(71) Applicant: Marvell International Ltd., Hamilton (BM)

(72) Inventor: Ross Swanson, Lyons, CO (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 14/012,743

(22) Filed: Aug. 28, 2013

Related U.S. Application Data

(63) Continuation of application No. 13/196,116, filed on Aug. 2, 2011, now Pat. No. 8,526,249.

(60) Provisional application No. 61/370,683, filed on Aug. 4, 2010.

(51) Int. Cl.
*G11C 7/00* (2006.01)
*G11C 8/00* (2006.01)

(52) U.S. Cl.
USPC ... 365/193; 365/194; 365/233.1; 365/233.13; 365/233.16; 365/233.17; 365/236

(58) Field of Classification Search
USPC ............ 365/193, 194, 233.1, 233.13, 233.16, 365/233.17, 236
See application file for complete search history.

(56) References Cited

U.S. PATENT DOCUMENTS

| | | | |
|---|---|---|---|
| 6,442,644 | B1 | 8/2002 | Gustavson et al. |
| 6,842,396 | B2 | 1/2005 | Kono |
| 8,081,527 | B1 | 12/2011 | Venkataraman et al. |
| 8,239,607 | B2 | 8/2012 | LaBerge |
| 8,305,821 | B2 | 11/2012 | Ware |

*Primary Examiner* — Trong Phan

(57) ABSTRACT

Methods and systems for detection and correction of timing signal drift in memory systems are provided. A start time and an end time of a first time interval is determined with control circuitry such that a last falling edge in a first of a plurality of data strobe sequences received from the memory occurs outside of the first time interval. A start time and an end time of a close-enable time interval is adjusted based at least in part on determining whether a second of the plurality of data strobe sequences occurs within the first time interval. Sampling of data received from the memory is disabled in response to determining that the last falling edge in the second received data strobe sequence occurs within the close-enable time interval.

20 Claims, 4 Drawing Sheets

METHODS AND SYSTEMS FOR DETECTING AND CORRECTING TIMING SIGNAL DRIFT IN MEMORY SYSTEMS

CROSS REFERENCE TO RELATED APPLICATION

This disclosure is a continuation of U.S. patent application Ser. No. 13/196,116 filed Aug. 2, 2011, now U.S. Pat. No. 8,526,249, which claims the benefit of U.S. Provisional Application No. 61/370,638, filed Aug. 4, 2010, each of which is hereby incorporated by reference herein in its entirety.

BACKGROUND OF THE DISCLOSURE

The background description provided herein is for the purpose of generally presenting the context of the disclosure. Work of the inventors hereof, to the extent the work is described in this background section, as well as aspects of the description that may not otherwise qualify as prior art at the time of filing, are neither expressly not impliedly admitted as prior art against the present disclosure.

The present disclosure relates to memory systems and methods, and more specifically to detection and correction of timing signal drift in memory systems.

When a host device in a memory system reads data from a memory such as double data rate synchronous dynamic random access memory (DDR SDRAM), the host may use a timing signal (such as a data strobe sequence) provided by the memory in order to sample the data received from the memory. In particular, the host device may send a 'Read' command to the memory, requesting data contained at a particular address in the memory. After some delay period, the memory may send a data burst to the host device concurrently with a data strobe sequence. The host device may phase shift the data strobe sequence and sample the received data signal at every rising and falling edge that occurs within the data strobe sequence.

The delay period between the transmission of the 'Read' command by the host device and the return transmission of the data burst and the data strobe sequence by the memory may fluctuate due to factors such as variation in supply voltage, ambient temperature, and other system parameters. The host device may perform training during system startup in order to estimate this delay period, as well as various timing parameters used to sample the data signal when reading data from memory. However, the fluctuations in temperature and voltage can cause the timing of the data strobe sequence (i.e., timing signal) to drift, causing the estimated delay period and timing parameters to become invalid, and resulting in system errors during a data read.

SUMMARY OF THE DISCLOSURE

Systems and methods are provided for detecting and correcting timing signal drift in memory systems.

In one the embodiment of the present disclosure, a method for reading data received from memory is provided. The method includes determining, with control circuitry, a start time and an end time of a first time interval (i.e., a sub-enable window) such that a last falling edge in a first of a plurality of data strobe sequences received from the memory occurs outside of the first time interval. For each of the plurality of data strobe sequences, the start time and the end time of the first time interval are determined relative to an estimated start time of each of the plurality of data strobe sequences. The plurality of data strobe sequences is used for sampling the data received from the memory. The method further includes adjusting a start time and an end time of a close-enable time interval based at least in part on determining whether a last falling edge in a second of the plurality of data strobe sequences occurs i) after the determined start time of the first time interval and ii) before the determined end time of the first time interval. The method further includes disabling the sampling of the data received from the memory in response to determining that the last falling edge in the second received data strobe sequence occurs inside the close-enable time interval.

In some implementations, the method further includes determining, with control circuitry, a start time and an end time of a second time interval such that the last falling edge in the first of the plurality of data strobe sequences received from the memory occurs i) after the start time of the second time interval and ii) after the end time of the second time interval. For each of the plurality of data strobe sequences, the start time and the end time of the second time interval are determined relative to an estimated start time of the each of the plurality of data strobe sequences. The last falling edge in the first of the plurality of data strobe sequences received from the memory occurs before the start time of the first time interval and before the end time of the first time interval. The method further includes adjusting the start time and the end time of the close-enable time interval based at least in part on determining whether the last falling edge in the second of the plurality of data strobe sequences occurs i) after the determined start time of the second time interval and ii) before the determined end time of the second time interval.

In some implementations, the first data strobe sequence includes a first sequence of symbols, the second data strobe sequence includes a second sequence of symbols, and first sequence of symbols is the same as the second sequence of symbols.

In some implementations, each of the plurality of data strobe sequences includes a preamble portion, a plurality of periodic transitions between high and low logic states, and a postamble portion. The data received from the memory is sampled at times corresponding to the plurality of periodic transitions.

In some implementations, a length of the close-enable time interval is less than or equal to a period of the periodic transitions.

In some implementations, a length of the first time interval is less than or equal to one half of a period of the periodic transitions, and a center of the first interval is substantially equal to the end time of the close-enable interval.

In some implementations, the method further includes incrementing a value of a counter in response to the determining that that last falling edge in the second of the plurality of data strobe sequences occurs after the determined start time of the first time interval and before the determined end time of the first time interval. The adjusting of the start time and the end time of a close-enable time interval is based at least in part on determining that the value of the counter is greater than a predetermined threshold.

In some implementations, the start time and the end time of the first time interval are determined based on a position of the close-enable time interval relative to the each of the plurality of data strobe sequences.

In some implementations, the memory is a double data rate (DDR) memory.

In some implementations, the memory is remote from the control circuitry.

BRIEF DESCRIPTION OF THE DRAWINGS

Further features of the disclosure, its nature and various advantages will be apparent upon consideration of the following detailed description, taken in conjunction with the accompanying drawings, in which like reference characters refer to like parts throughout, and in which.

DETAILED DESCRIPTION

To provide an overall understanding of the disclosure, certain illustrative embodiments will now be described. However, the systems and methods described herein may be adapted and modified as is appropriate for the application being addressed and that the systems and methods described herein may be employed in other suitable applications, and that such other additions and modifications will not depart from the scope hereof.

Figure 1:
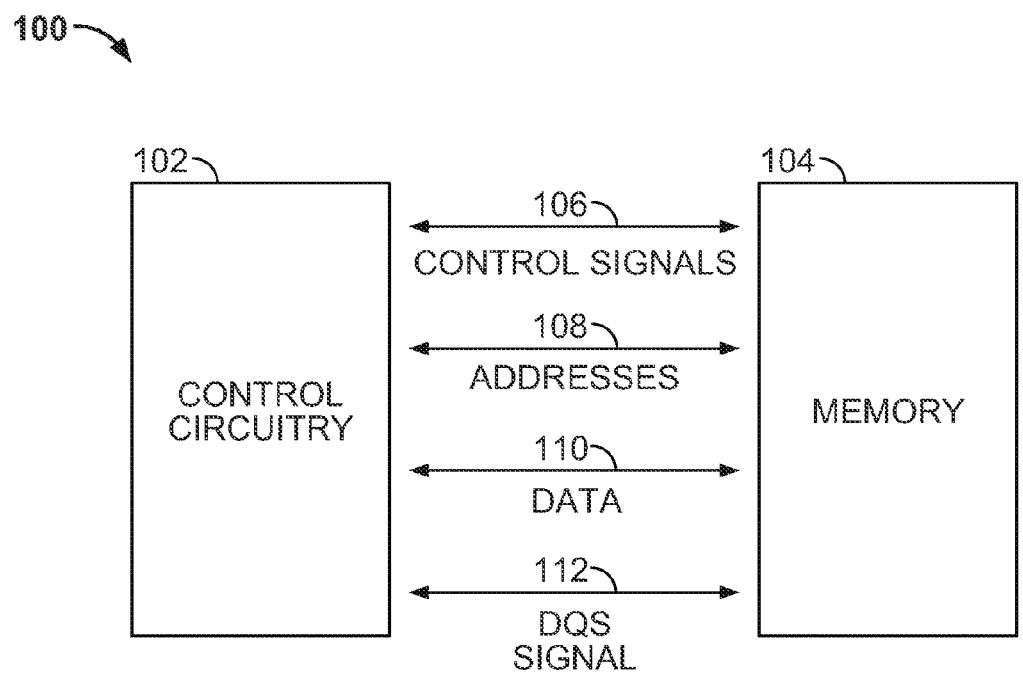
FIG. 1 shows an exemplary system for reading data received from memory according to an embodiment of the present disclosure.

FIG. 1 shows an exemplary system 100 for reading data received from memory according to an embodiment of the present disclosure. In some embodiments, system 100 may be a part of a larger data processing system.

System 100 includes a memory 104. In some embodiments, the memory 104 is a non-volatile memory such as e.g. read only memory (ROM) or Flash memory. In some embodiments, the memory 104 is a volatile memory such as e.g. static random access memory (SRAM) or dynamic random access memory (DRAM). In some embodiments, the memory 104 is a synchronous dynamic random access memory (SDRAM). In some embodiments, the memory 104 is magnetic memory. In some embodiments, the memory 104 is optical memory. In some embodiments, the memory 104 is holographic memory. In general, the memory 104 may be implemented as any other type of memory without departing from the scope of the present disclosure.

System 100 further includes control circuitry 102 (i.e., memory controller circuitry, or host circuitry) configured to communicate with the memory 104. In some embodiments, the control circuitry 102 and the memory 104 may be coupled to a system bus (not shown), and may communicate via the system bus. In some embodiments, the control circuitry 102 and/or the memory 104 are synchronized to the system bus. In some embodiments, the control circuitry 102 includes a memory controller that is coupled to an external processor. In some embodiments, the processor is a general purpose processor. In some embodiments, the control circuitry 102 is remote from the memory 104

The control circuitry 102 may write data to the memory 104 and read data from the memory 104. The control circuitry 102 may write data to the memory 104 by providing the data as data signal 110, providing an address 108 within the memory 104 to which the data is to be written, providing various associated control signals 106, and providing a data strobe signal (i.e., a timing signal, or a DQS signal) 112. In some embodiments, the data strobe signal 112 may include a plurality of consecutive rising and falling edges, and the memory 104 may use the rising and/or the falling edges of the data strobe signal 112 to synchronously sample the data signal 110.

As used herein, a rising edge is a transition within a given signal from a low logic value to a high logic value. As used herein, a falling edge is a transition within a given signal from a high logic value to a low logic value. In some embodiments, the time intervals between consecutive rising and falling edges are substantially the same. In these embodiments, the data strobe signal periodically transitions between a high logic value and a low logic value.

The control circuitry 102 may also read data from the memory 104 by providing a 'Read' command to the memory 104 using control signal 106, as well as providing an address 108 within the memory 104 from which the data is to be read. The memory 104 may then provide the requested data as data signal 110, as well as providing the data strobe signal 112. In some embodiments, the data strobe signal 112 may include a plurality of rising and falling edges, and the control circuitry 102 may use the rising and/or the falling edges of the data strobe signal 112 to synchronously sample the data signal 110.

It should be noted that although the control signals 106, the address signals 108, the data signals 110 and the data strobe signal 112 are shown in FIG. 1 as separate signals, one or more of these signals may be transmitted in combination, for example by using a data bus (not shown) to which both the control circuitry 102 and the memory 104 are coupled. In some embodiments, one or more of these signals may be transmitted in parallel fashion on separate bus lines. In some embodiments, one or more of these signals may be transmitted in serial fashion on a single bus line.

In some embodiments, the data strobe signal 112 is a tri-state signal. As used herein, a tri-state signal is a signal which may be placed in a high logic state (i.e., have a high logic value, such as a logic '1'), placed in a low logic state (i.e., have a low logic value, such as a logic '0'), or may be tri-stated. When the signal is tri-stated, the signal is not driven by any source, and can float to an indeterminate voltage level different from voltage levels used to encode the high and low logic values.

In some embodiments, the data strobe signal 112 is a bi-directional signal. As used herein, a bi-directional signal is a signal that may either be transmitted by the control circuitry 102 and received by the memory 104 (e.g., during data writes), or be transmitted by the memory 104 and received by the control circuitry 102 (e.g., during data reads).

In some embodiments, the data strobe signal 112 includes a plurality of consecutive rising and falling edges. In these embodiments, the control circuitry 102 and the memory 104 may use the data strobe signal 112 to transfer data using double data rate (DDR) signaling. As used herein, DDR signaling involves transferring data between the memory 104 and the control circuitry 102 on both the rising and falling edges of the data strobe signal 112.

In some embodiments, as will be described in further detail below, the control circuitry 102 may perform a training routine in order to estimate various timing parameters used to sample the data signal 110 when reading data from the memory 104. However, fluctuations in temperature and voltage can cause the timing of the data strobe sequence to drift, causing the estimate timing parameters to become invalid, resulting in system errors during a data read. Accordingly, the control circuitry 102 of system 100 according to the present disclosure is configured to detect and correct drift in the data strobe signal 112.

Figure 2:
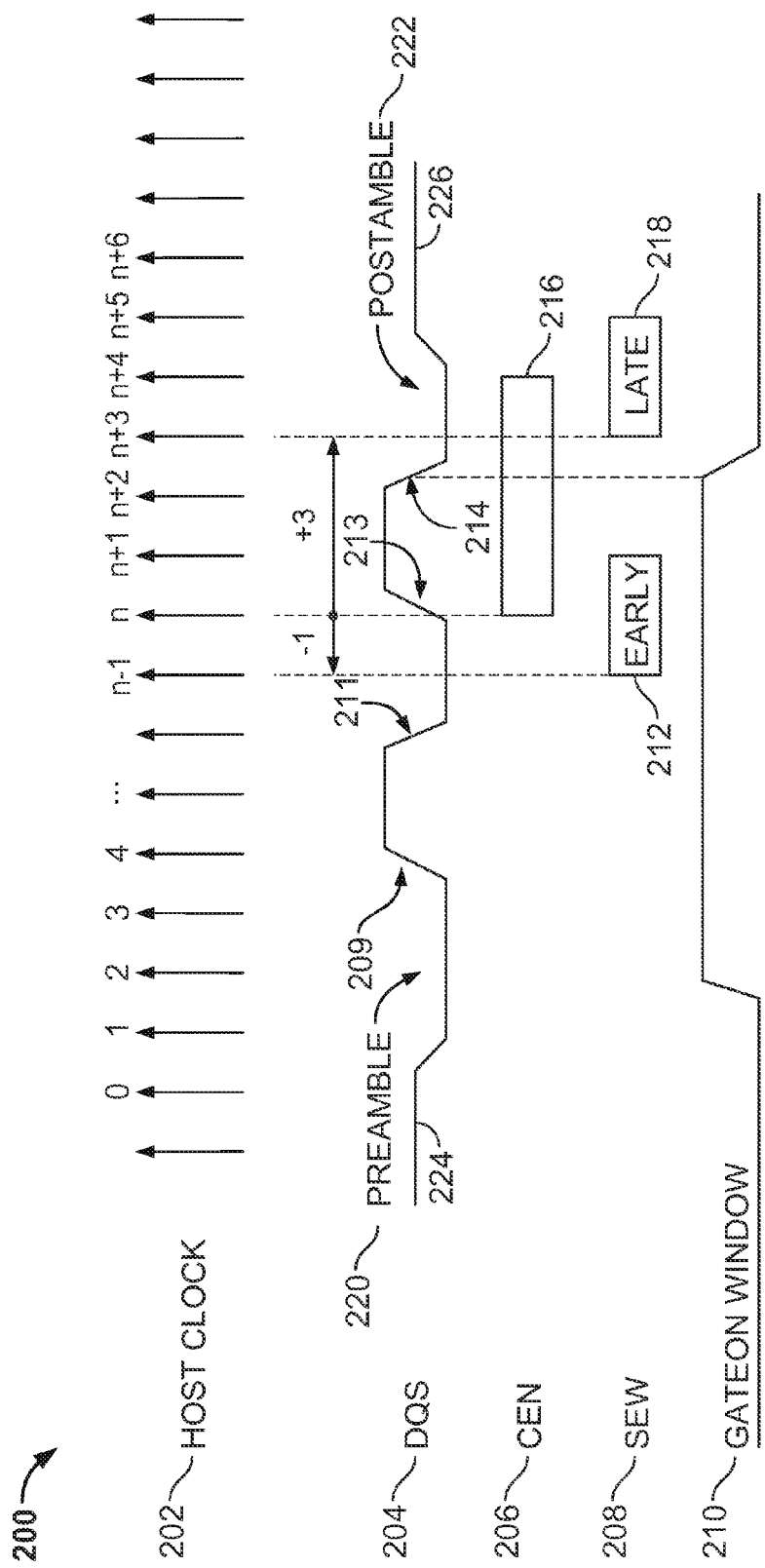
FIG. 2 shows an exemplary signal diagram of various signals involved in reading data received from memory according to an embodiment of the present disclosure.

FIG. 2 shows an exemplary signal diagram 200 of various signals involved in reading data received from memory according to an embodiment of the present disclosure. In some embodiments, the various signals of signal diagram 200 involved in reading data received from memory may be those of system 100 shown in FIG. 1.

The control circuitry 102 of system 100 may have a host clock 202. Host clock 202 is a clock that measures incremental time periods 0, 1, 2, 3, 4, ..., n−1, n, n+1, n+2, n+3, n+4, n+5, and n+6 among others. The rising edges of host clock 202 are represented in FIG. 2 by upward arrows. In some embodiments, the host clock 202 of the control circuitry 102 has either the same, two, or four times the clock rate of a clock used by the memory 104 (not shown).

During a data read, data from the memory 104 may be received by the control circuitry 102 in bursts (i.e., data bursts). In some embodiments, the data bursts have even lengths. For example, data bursts of length 2, 4, or 8 may be supported by a communication protocol between the memory 104 and the control circuitry 102.

In order to properly sample a received data burst, the control circuitry 102 uses a data strobe sequence 204 provided by the memory 104 concurrently with the data burst. The data strobe sequence 204 may be comprised of a preamble 220, a consecutive sequence of rising and falling edges, and a postamble 222. In some embodiments, the interval between consecutive rising and falling edges is uniform. For example, the interval between the rising and falling edges may be substantially equal to two clock periods of the host clock 202. In some embodiments, the data strobe signal 112 may be tri-stated when a data strobe sequence such as data strobe sequence 204 is not being transmitted. This the tri-state of the data strobe signal 112 is shown as signal level 224 preceding the data strobe sequence 204 sequence and signal level 226 following the data strobe sequence 204.

In some embodiments, the number of rising and falling edges between a preamble and a postamble of a data strobe sequence corresponds to the number of data bits in a data burst. For example, the data strobe sequence 204 contains rising edges 209 and 213, and falling edges 211 and 214, and may be used to sample a data burst of length 4 if DDR signaling is used. In other embodiments, data burst sequence 204 may contain a different number of rising and falling edges between the preamble 224 and the postamble 226.

A received data burst may be synchronized with a received data strobe sequence 204. In these embodiments, the length of one bit of data in the data burst signal may be the same as the interval between consecutive rising and falling edges (such as rising edge 209 and falling edge 211) of the data burst sequence 204. Furthermore, the transitions in consecutive bits of the received data burst may occur at the same time as the rising and falling edges of the received data strobe signal 204. For example, the first bit of the received data burst may begin at the same time as the rising edge transition 209 occurs, the second bit of the received data bust may begin at the same time as the falling edge transition 211 occurs, etc.

In operation, the control circuitry 102 may send a 'Read' command to the memory 104 using the control signal 106, along with an address (sent using the address signal 108) of the memory portion to be read. The control circuitry 102 may monitor the communication link used to receive the data strobe signal 112 for the preamble symbol 220. The control circuitry 102 may use the edge transitions (i.e., the rising and falling edges) within the data strobe sequence 204 to sample the received data burst. In order to sample the data burst, the control circuitry 102 may delay the received data strobe sequence 204 such that the edge transitions 209, 211, 213 and 214 occur in the middle of each bit of the received data burst. In the illustrative example of FIG. 2, the length of a data bit in a data burst may correspond to two periods of the host clock 202. The control circuitry 102 may consequently delay the received data strobe sequence 204 by one period of the host clock 202, such that the rising edge 209 occurs in the middle of the first bit of the received data burst, the falling edge 211 occurs in the middle of the second bit of the received data burst, etc. Accordingly, if the control circuitry 102 samples the received data burst in response to detecting each rising and falling edge of the delayed data strobe sequence 204, the control circuitry 102 obtains samples from the middle of the first, second, third, and fourth bits of the received data bursts.

The communication link used by the control circuitry 102 to receive the data strobe signal 112 may be subject to random noise. In order to prevent erroneous detection of edge transitions and subsequent erroneous sampling of the data signal 110, control circuitry 102 may use a gating (i.e., windowing) signal such as the gateon window signal 210. Sampling of the data signal 110 by the control circuitry 102 in response to detecting edge transitions in the data strobe signal 112 may be enabled when the gateon signal 210 has a high logic value, and disabled when the gateon signal has a low logic value. The control circuitry 102 may set the gateon signal 210 to a high logic value after transmitting the 'Read' command to the memory 104 and waiting for some predetermined delay period. Alternatively or additionally, the control circuitry 102 may set the gateon signal 210 to a high logic value in response to detecting the preamble of the data strobe sequence 204. The delay period accounts for the delay between i) the transmission of the 'Read' command by the control circuitry 102 and ii) the beginning of the transmission of a data burst and the data strobe sequence 204 by the memory 104. The delay may depend on environmental factors such as supply voltage and ambient temperature, as well as factors like overall system latency.

The delay period used by the control circuitry 102 may be determined using a training routine. For example, the control circuitry 102 may repeatedly request that memory 104 provide predetermined training sequences known to the control circuitry 102. The control circuitry 102 may then sweep through a range of values of the delay period, comparing the sequences sampled using a particular delay period to corresponding known reference sequences in order to determine the suitability of that particular delay period, and ultimately to select the most appropriate value of the delay period (i.e., a delay period that produces the fewest discrepancies between received and reference training sequences).

The control circuitry 102 may use the last falling edge 214 within the received data strobe sequence 204 in order to set the gateon signal 210 to a low logic value at the end of the data strobe sequence 204. However, as described previously, variations in supply voltage and temperature may affect the delay between i) the transmission of the 'Read' command by the control circuitry 102 and ii) the return transmission of the data burst and data strobe sequence 204 by the memory 104. Accordingly, the value of the delay may gradually deviate from the value determined during the training routine. Accordingly, even though the time of assertion (i.e., placing in a high logic state) of the gateon signal 210 relative to the beginning of the preamble 220 (and relative to the last falling edge 214) of the data strobe signal 204 is known at the time the training routine finishes, the time of assertion alone can not be used to accurately determine the position of the last falling edge 214 because of the gradual deviations. Thus, in one embodiment, the control circuitry 102 uses another windowing signal—a close enable signal (CEN) 206 illustrated by a close enable window 216—in order to detect the last falling edge 214 of the data strobe sequence 204.

The close enable signal 216 is used by the control circuitry 102 to detect the last falling edge 214 of the data strobe sequence 204 in order to place the gateon signal 210 in a low logic state at the end of the data strobe sequence 204. In other words, the control circuitry 102 places the gateon signal 210 in a low logic state in response to detecting a falling edge within the data strobe sequence 204 only when that falling edge occurs after the start time and before the end time of the close enable window 216. In some embodiments, the start and end times of the close enable window 216 are determined relative to the time that the gateon window 210 is asserted to a high logic value. Consequently, in these embodiments, the start and end times of the close enable window 216 are determined relative to the estimated start time of the data strobe sequence 204. In some embodiments, the close enable window 216 has a length substantially equal to the interval between two consecutive rising or falling edges of the data strobe signal. For example, the illustrative close enable window 216 of FIG. 2 has a length substantially equal to four clock cycles of the host clock 202, while the interval between consecutive falling edges is substantially equal to two clock cycles of the host clock 202. Advantageously, a close enable window 216 of such length may contain only one complete falling edge of the data strobe sequence 204.

Variations in supply voltage and temperature affecting system 100 may cause the last falling edge 214 of the data strobe sequence 204 to gradually drift out of the close enable window 216. Should such an event occur, the close enable window 216 may contain no falling edge, or a falling edge which is not the last falling edge 214 of the data strobe sequence 204. If the close enable window 216 contains no falling edge, the gateon signal may be left in a high logic value after the end of the data strobe sequence and associated data burst, which may result in the erroneous sampling of data by the control circuitry 102 due to erroneously detected edge transitions in the tri-stated data strobe signal 112. If the close enable window 216 contains a falling edge which is not the last falling edge 214 of the data strobe sequence 204, the gateon signal may be placed in a low logic state before the end of the data burst, causing the control circuitry 102 to ignore one or more bits of data in the data burst transmitted by the memory 104.

In order to detect the drift of the last falling edge 214 of the data strobe sequence 204 out of the close enable window 216, two sub-enable windows (SEWs) 212 and 218 may be placed near the beginning and near the end of the close enable window 216. In some embodiments, each of the sub-enable windows 212 and 218 is one half of the length the close-enable window 216. For example, the illustrative sub-enable windows 212 and 218 shown in FIG. 2 have a length substantially equal to two periods of the host clock 204. However, each of the sub-enable windows 212 and 218 may have any other length. In some embodiments, the 'early' sub-enable window 212 may be centered on the starting time of close enable window 216, and the 'late' sub-enable window 218 may be centered on the ending time of close enable window 216. For example, the starting time of the illustrative sub-enable window 212 shown in FIG. 2 is delayed by one period (−1) of the host clock 202 relative to the starting time of the close enable window 216. The starting time of the illustrative sub-enable window 218 shown in FIG. 2 is advanced by three periods (+3) of the host clock 202 relative to the starting time of the close enable window 216. However, each of the sub-enable windows 212 and 218 may be placed in any other position relative to the close enable window 216. In these embodiments, the start and end times of the close enable window 216 are determined relative to the estimated start time of the data strobe sequence 204. Accordingly, in these embodiments, the respective start and end times of the sub-enable windows 212 and 218 are determined relative to the estimated start time of the data strobe sequence 204. It should be noted that the use of both of the sub-enable windows 212 and 218 is optional. That is, one of the sub-enable windows 212 and 218 may be omitted without departing from the scope of the present disclosure.

In some embodiments, the position of the close enable window 216 and the sub-enable windows 212 and 218 are determined at the time the training routine is performed. In some embodiments, during the training routine, the close enable window 216 and sub-enable windows 212 and 218 are sized and positioned such that the last falling edge 214 of the data strobe sequence 204 is contained within the close enable window 216, but is not contained within either the sub-enable window 212 or the sub-enable window 218. That is, the last falling edge 214 occurs after the start time and before the end time of the close enable window 214. However, the last falling edge 214 occurs i) after the start and end times of the sub-enable window 212 and ii) before the start and end times of the sub enable window 218.

During the course of operation of system 100, the time at which the last falling edge of a particular received data strobe sequence occurs may gradually drift until the last falling edge is within the 'early' sub-enable window 212 or within the 'late' sub-enable window 218. These events may be recorded by the control circuitry 102. For example, the control circuitry 102 may increment a counter (not shown) associated with the sub-enable window 212 if a last falling edge of a received data strobe sequence occurs within the sub-enable window 212. Likewise, the control circuitry 102 may increment a counter (not shown) associated with the sub-enable window 218 if a last falling edge of a received data strobe sequence occurs within the sub-enable window 218.

In some embodiments, the control circuitry 102 may adjust one or more of the signals shown in FIG. 2 based on the values of the counters associated with the sub-enable windows 212 and 218. For example, if the control circuitry 102 determines that more than a predetermined number of received data strobe sequences have a last falling edge that occurs within the sub-enable window 212 and/or the sub-enable window 218 (i.e., the counter associated with the sub-enable window 218 and/or the counter associated with the sub-enable window 218 becomes greater than some the predetermined number), the control circuitry 102 may adjust one or more of the signals shown in FIG. 2. For example, in some embodiments, the control circuitry 102 may adjust the predetermined amount of delay after which the gateon signal 210 is asserted. In some examples, the control circuitry 102 may adjust the length and/or the position of the close enable window 216. In some embodiments, the control circuitry 102 may adjust the length and/or the position of the sub-enable window 212. In some embodiments, the control circuitry 102 may adjust the length and/or the position of the sub-enable window 218. In some embodiments, the amount of time by which the received data strobe sequence 204 is delayed relative to a received data burst. In some embodiments, the control circuitry 102 may re-execute the training routine, in the manner previously described.

Advantageously, the sub-enable windows 212 and 218 allow the control circuitry 102 to detect that the last falling edges of received data strobe sequences are drifting out of the close enable window 216. The control circuitry 102 is able to take appropriate corrective action, thus preventing erroneous reading of data provided by the memory 104.

In some embodiments, the control circuitry 102 includes a memory controller and a processor. In these embodiments, the memory controller may store the counters associated with the sub-enable windows 212 and 218. The processor may periodically request from the memory controller the values of the counters and adjust one or more of the signals shown in FIG. 2 based on the values of the counters. Advantageously, because the processor does not need to examine every received data strobe sequence, but rather receives aggregate information about a plurality of data strobe sequences, the processor may devote fewer resources to detection and correction of drift of the timing signal (i.e., the data strobe signal 112) in system 110.

Figure 3:
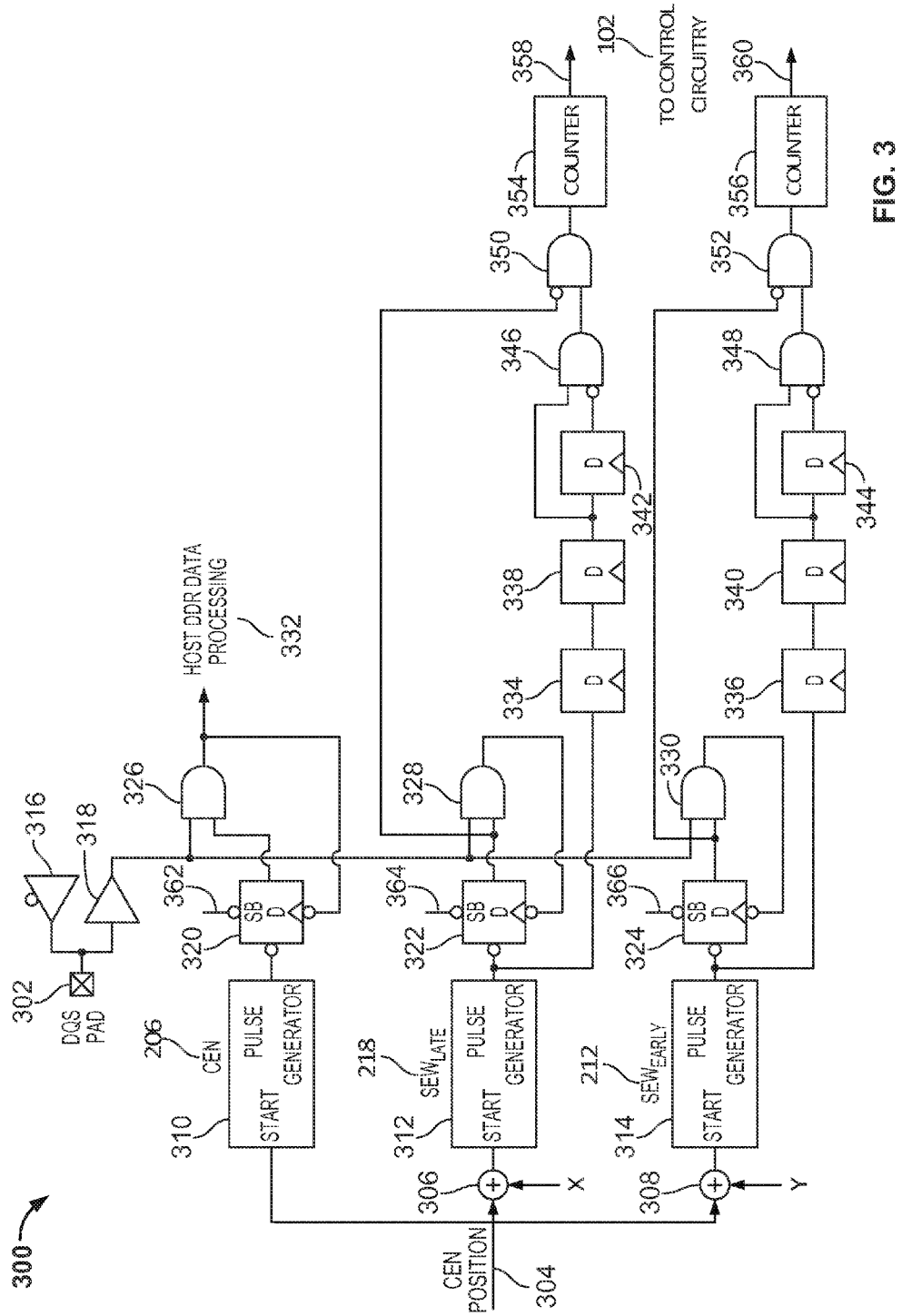
FIG. 3 shows another exemplary system for reading data received from memory according to an embodiment of the present disclosure.

FIG. 3 shows an exemplary system 300 for reading data received from memory (e.g., memory 104) according to an embodiment of the present disclosure. In the following passages, system 300 will be described as being part of the control circuitry 102 of system 100 shown in FIG. 1. However, the system 300 may be included in any other system that reads data from memory without departing from the scope of the present disclosure.

System 300 includes an input/output pad 302. In some embodiments, the input/output pad 302 is coupled to the memory 104. System 300 may transmit a data strobe signal to the memory 104 via the input/output pad 302 using the output buffer 316 and other circuitry (not shown). System 300 may also receive a data strobe signal, such as the data strobe sequence 204 shown in FIG. 2, from the memory 104 via the input/output pad 302 using the input buffer 318 and other circuitry.

During a data read operation, the control circuitry 102 sends a 'Read' command to the memory 104. A predetermined amount of time after the 'Read' command is sent, system 300 may instruct a close enable pulse generator 310 to generate a close enable window signal, such as the close enable window signal 216 shown in FIG. 2, by asserting the control signal 304. In certain embodiments, control signal 304 is the position of the close enable window (CEN POSITION).

Control signal 304 may also be used to instruct an 'early' sub-enable window pulse generator 314 to generate an 'early' sub-enable window signal, such as the sub-enable window signal 212 shown in FIG. 2. Element 308 may temporally advance the assertion of the control signal 304 by a numerical value of Y, and consequently the generation of the 'early' sub-enable window by the pulse generator 314. In some embodiments, the element 308 may advance the assertion of the control signal 304 by a numerical value of Y that is one period of the host clock 202. In these embodiments, the 'early' sub-enable window generated by the pulse generator 314 is advanced by one period of the host clock 202 with respect to the start time of the close enable window generated by the pulse generator 310, much like the 'early' sub-enable window 212 is advanced by one period of the host clock 212 with respect to the start time of the close enable window 216 shown in FIG. 2.

Control signal 304 may also be used to instruct a 'late' sub-enable window pulse generator 312 to generate a 'late' sub-enable window signal, such as the sub-enable window signal 218 shown in FIG. 2. Element 306 may temporally delay the assertion of the control signal 304 by a numerical value X, and consequently the generation of the 'late' sub-enable window by the pulse generator 312. In some embodiments, the element 306 may delay the assertion of the control signal 304 by a numerical value of X that is three periods of the host clock 202. In these embodiments, the 'late' sub-enable window generated by the pulse generator is delayed by three periods of the host clock 202 with respect to the start time of the close enable window generated by the pulse generator 310, much like the 'late' sub-enable window 218 is delayed by three periods of the host clock 202 with respect to the start time of the close enable window 216 shown in FIG. 2.

System 300 further includes a D-type flip-flop 320 and an AND gate 326. A first input of the AND gate 326 is connected to the data strobe signal output by the input buffer 318. A second input of the AND gate 326 is connected to the output of the flip-flop 320. The AND gate 326 outputs a signal that is a logical AND function of its two inputs to a host DDR data processing unit 332.

A data input of the flip-flop 320 is connected to the output of the close enable pulse generator 310. A clock input of the flip-flop 320 is connected to the output of the AND gate 326. Because the clock input of the flip-flop 320 is inverted, the flip-flop 320 clocks in (i.e., stores) the data provided at its data input on the falling edge of its clock input. A 'set' input of the flip-flop 320 is connected to a signal 362. In some embodiments, the 'set' input of the flip-flop 320 is an active low 'set' input (i.e., SB). In some embodiments, the active low 'set' input of the flip-flop 320 is activated by the same an active low pulse (not shown) that is used during the preamble 220 to turn on the gateon window 210. The data input, clock input, and 'set' input of the flip-flop 320 are inverted. As will be described below, the output of the flip-flop 320 is a gateon window signal such as e.g. the gateon window signal 210 shown in FIG. 2.

When no data is being transmitted from the memory 104 to the control circuitry 102, a data strobe signal 112 coupled to the input/output pad 102 is tri-stated, and the input buffer 318 may output a low logic value. Furthermore, the set input of the flip-flop 320 is de-asserted, and the flip flop 320 outputs a low logic value. Accordingly, the AND gate 326 outputs a low logic value. A predetermined time after a 'Read' command is transmitted to the memory 104 by the control circuitry 102, the 'set' input of the flip-flop 320 is briefly asserted, and the flip-flop 320 begins to output a high logic value. When the flip-flop 320 outputs a high logic value, the AND gate 326 essentially serves as a buffer for the data strobe signal output by the input buffer 318. That is, if the flip-flop 320 outputs a high logic value, then when the data strobe signal has a high logic value, the AND gate 326 outputs a high logic value, and when the data strobe signal has a low logic value, the AND gate 326 outputs a low logic value.

A predetermined period of time after the 'Read' command is sent, system 300 may instruct a close enable pulse generator 310 to generate a close enable window signal (such as the close enable window signal 216) by asserting the control signal 304. Before the control signal 304 instructs the pulse generator 310 to generate a close enable window signal, the pulse generator 310 outputs a low logic value. Correspondingly, the inverted input to the flip-flop 310 has a high logic value. Accordingly, when the pulse generator 310 outputs a low logic value, the flip-flop 320 clocks in (i.e., stores) a high logic value every time at every falling edge of the clock input signal (i.e., the output of the AND gate 326). Thus, when the pulse generator 310 outputs a low logic value, the flip-flop 320 outputs a high logic value.

After the control signal 304 instructs the pulse generator 310 to generate a close enable window signal (such as the close enable window signal 216), the pulse generator 310 outputs a high logic value for a predetermined period of time (i.e., for the duration of the close enable window). Correspondingly, the inverted input to the flip-flop 320 has a low logic value. However, the flip-flop 320 continues to output a high logic value unless a falling edge occurs in the received data strobe signal while the close enable signal has a high value. For example, if various signals correspond to those shown in FIG. 2, the flip-flop 320 continues to output a high logic value unless the falling edge 214 of the data strobe sequence 204 occurs while the close enable signal 216 has a high logic value. In this case, the flip-flop 320 begins to output a low logic value when the falling edge 214 occurs, which corresponds to the closing of the gateon window 214. In some embodiments, the start and end time for asserting the close enable window signal are chosen during a training routine such that a falling edge that occurs when the close enable window signal is asserted is the last falling edge of a data strobe sequence. If a falling edge of the data strobe signal occurs when the close enable window signal is asserted, a low logic value is clocked into the flip-flop 320, and the flip-flop 320 begins to output a low logic level.

Accordingly, the flip-flop 320 outputs a gateon window signal, such as e.g. the gateon window signal 210, which is asserted during the preamble of a received data strobe sequence, and de-asserted concurrently with the last falling edge of the received data strobe sequence, provided that the last falling edge of the received data strobe sequence occurs when the close enable signal produced by the close enable pulse generator 310 is asserted. The AND gate 326 outputs a windowed (i.e., gated) version of the received data strobe sequence. That is, the AND gate 326 outputs the received data strobe sequence when the gateon window signal output by the flip-flop 320 is asserted. When the gateon window signal output by the flip-flop 320 is de-asserted the AND gate 326 outputs a low logic value. In some embodiments, the output of the AND gate is used by the control circuitry 102 to sample a received data burst.

System 300 further includes a D-type flip flop 322 and an AND gate 328. A first input of the AND gate 328 is connected to the data strobe signal output by the input buffer 318. A second input of the AND gate 328 is connected to the output of the flip-flop 322. The AND gate 328 outputs a signal that is a logical AND function of its two inputs.

A data input of the flip-flop 322 is connected to the output of the 'late' sub-enable window pulse generator 312. A clock input of the flip-flop 322 is connected to the output of the AND gate 328. Because the clock input of the flip-flop 322 is inverted, the flip-flop 322 clocks in (i.e., stores) the data provided at its data input on the falling edge of its clock input. A 'set' input of the flip-flop 322 is connected to a signal 364. In some embodiments, the 'set' input of the flip-flop 320 is an active low 'set' input (i.e., SB). In some embodiments, the active low 'set' input of the flip-flop 322 is activated by the same an active low pulse (not shown) that is used during the preamble 220 to turn on the gateon window 210. The data input, clock input, and 'set' input of the flip-flop 322 are inverted.

The flip-flop 322 and AND gate 328 are configured to operate in a manner similar to that of flip-flop 320 and AND gate 328. Accordingly, the flip-flop 322 outputs a signal which is asserted during the preamble of a received data strobe sequence and de-asserted concurrently with the last falling edge of the received data strobe sequence, provided that the last falling edge of the received data strobe sequence occurs when the 'late' sub-enable window signal produced by the pulse generator 312 is asserted. The AND gate 328 outputs a windowed (i.e., gated) version of the received data strobe sequence. That is, the AND gate 328 outputs the received data strobe sequence when the signal output by the flip-flop 322 is asserted. When the signal output by the flip-flop 322 is de-asserted, the AND gate 328 always outputs a low logic value.

System 300 further includes D-type flip-flops 334, 338 and 342 and a two input AND gate 346. The first input of the AND gate 346 is connected to an output of the flip-flop 338, and the second input of the AND gate 346 is connected to an inverted output of the flip-flop 342. A data input of the flip-flop 334 is connected to the output of the 'late' sub-enable pulse generator 312, a data input of the flip-flop 338 is connected to an output of the flip-flop 334, and a data input of the flip-flop 342 is connected to the output of the flip-flop 338. In some embodiments, clock inputs of the flip flops 334, 338 and 342 are connected to a host clock signal of the control circuitry 102, such as the host clock 202 shown in FIG. 2. In these embodiments, the flip-flops 334, 338 and 342 act as a three-step delay line. That is, the outputs of the flip-flops 334, 338 and 342 are delayed by one, two, and three clock cycles of the host clock, respectively, with respect to the output of the 'late' sub-enable pulse generator 312.

Together, the flip-flop 342 and the AND gate 346 form a rising edge detector. That is, the AND gate 346 outputs a high logic value at time m+1 only when the flip-flop 338 outputs a low logic value at time m and a high logic value at the time m+1. The AND gate 346 outputs a low logic value for all other pairs of consecutive logic levels output by the flip-flop 338. Because the 'late' sub-enable window signal output by the pulse generator 312 has a single rising edge, and because the 'late' sub-enable window signal is output by the pulse generator 312 exactly once after a particular 'Read' command is transmitted by the control circuitry 102, the rising edge detector formed by the flip-flop 342 and the AND gate 346 outputs a high logic value for one period of the host clock exactly once for each received data strobe sequence.

System 300 further includes a two input AND gate 350. The first input of the AND gate 350 is connected to an inverted version of the signal output by the flip-flop 322. The second input of the AND gate 350 is connected to the output of the AND gate 346.

In following discussion, reference will be made to the illustrative data strobe sequence 204 shown in FIG. 2. It should be noted that the preamble of the data strobe sequence 204 begins at a time referred to in FIG. 2 as time 0 of the host clock 202.

In the illustrative system 300, the 'late' sub-enable window signal output by the pulse generator 312 has a duration of two clock cycles. Accordingly if the 'late' sub-enable window signal is asserted at time n+3 and de-asserted at time n+5 (as shown by the 'late' sub-enable window in FIG. 2), the AND gate 346 outputs a high logic value for one clock cycle at time n+5. Furthermore, if the last falling edge of the received data strobe sequence occurs while the 'late' sub-enable window signal produced by the pulse generator 312 is asserted (i.e., between time n+3 and n+5), the signal output by the flip-flop 322 will have a low logic value at time n+5. Accordingly, the AND gate 350 outputs a high logic value between times n+5 and n+6. However, if the last falling edge of the received data strobe sequence occurs while the 'late' sub-enable window signal produced by the pulse generator 312 is de-asserted (i.e., outside of the time interval defined by times n+3 and n+5), the output of the flip-flop 322 will have a high logic value at time n+5. Accordingly, the AND gate 350 outputs a low logic value between times n+5 and n+6.

As discussed previously, the AND gate 346 outputs a high logic value for the duration of one clock cycle exactly once for each received data strobe sequence (i.e., between times n+5 and n+6). Accordingly, if a data strobe sequence received at time 0 and the last falling edge of the received data strobe sequence occurs while the 'late' sub-enable window signal produced by the pulse generator 312 is asserted (i.e., within the time interval defined by times n+3 and n+5), the AND gate 350 outputs a high logic value for the duration of one clock cycle between times n+5 and n+6, and outputs a low logic value for all other times. However, if the last falling edge of the received data strobe sequence occurs while the 'late' sub-enable window signal produced by the pulse generator 312 is de-asserted (i.e., outside of the time interval defined by times n+3 and n+5), the AND gate 350 outputs a low logic value at all times associated with receipt of the data strobe sequence 204.

System 300 further includes a counter 354 connected to the output of the AND gate 350. The counter 354 increments its count by one in response to receiving a high logic value from the AND gate 350. Accordingly, the counter 354 increments its value by one if the last falling edge of a received data strobe sequence occurs while the 'late' sub-enable window signal produced by the pulse generator 312 is asserted. Portions of the control circuitry 102 may access the value of counter 354 via the output port 358 of the counter 354.

System 300 further includes a D-type flip flop 324 and an AND gate 330. A first input of the AND gate 330 is connected to the data strobe signal output by the input buffer 318. A second input of the AND gate 330 is connected to the output of the flip-flop 324. The AND gate 330 outputs a signal that is a logical AND function of its two inputs.

A data input of the flip-flop 324 is connected to the output of the 'early' sub-enable window pulse generator 314. A clock input of the flip-flop 324 is connected to the output of the AND gate 330. Because the clock input of the flip-flop 324 is inverted, the flip-flop 324 clocks in (i.e., stores) the data provided at its data input on the falling edge of its clock input. A 'set' input of the flip-flop 324 is connected to a signal 366. In some embodiments, the 'set' input of the flip-flop 324 is an active low 'set' input (i.e., SB). In some embodiments, the active low 'set' input of the flip-flop 324 is activated by the same an active low pulse (not shown) that is used during the preamble 220 to turn on the gateon window 210. In some embodiments, the 'set' inputs of flip-flops 320, 322 and 324 are connected to each other. The data input, clock input, and 'set' input of the flip-flop 324 are inverted.

The flip-flop 324 and AND gate 330 are configured to operate in a manner similar to the flip-flop 320 and AND gate 326. Accordingly, the flip-flop 324 outputs a signal which is asserted during the preamble of a received data strobe sequence and de-asserted concurrently with the last falling edge of the received data strobe sequence 204, provided that the last falling edge of the received data strobe sequence occurs when the 'early' sub-enable window signal produced by the pulse generator 314 is asserted. The AND gate 330 outputs a windowed (i.e., gated) version of the received data strobe sequence. That is, the AND gate 330 outputs the received data strobe sequence when the signal output by the flip-flop 326 is asserted. When the signal output by the flip-flop 324 is de-asserted, the AND gate 330 outputs a low logic value.

System 300 further includes D-type flip-flops 336, 340 and 344 and a two input AND gate 348. The first input of the AND gate 348 is connected to an output of the flip-flop 340, and the second input of the AND gate 348 is connected to an inverted output of the flip-flop 344. A data input of the flip-flop 336 is connected to the output of the 'early' sub-enable window pulse generator 314, a data input of the flip-flop 340 is connected to an output of the flip-flop 336, and a data input of the flip-flop 344 is connected to the output of the flip-flop 340. In some embodiments, clock inputs of the flip flops 336, 340 and 344 are connected to a host clock signal of the control circuitry 102, such as the host clock 202 shown in FIG. 2.

System 300 further includes a two input AND gate 352. The first input of the AND gate 352 is connected to an inverted version of the signal output by the flip-flop 324. The second input of the AND gate 352 is connected to the output of the AND gate 348.

Elements 314, 324, 330, 336, 340, 344, 348 and 352 of system 300 are configured to operate in a fashion similar to elements 312, 322, 328, 334, 338, 342, 346 and 350 of system 300. Accordingly, for a data strobe sequence 204 received at time 0, the AND gate 348 outputs a high logic value for the duration of one clock cycle exactly once for each received data strobe sequence (i.e., between times n+1 and n+2). Accordingly, if the last falling edge of the received data strobe sequence occurs while the 'early' sub-enable window signal produced by the pulse generator 314 is asserted (i.e., within the time interval defined by times n−1 and n+1), the AND gate 352 outputs a high logic value for the duration of one clock cycle between times n+1 and n+2, and outputs a low logic value for all other times associated with receipt of the data strobe sequence. However, if the last falling edge of the received data strobe sequence occurs while the 'early' sub-enable window signal produced by the pulse generator 314 is de-asserted (i.e., outside of the time interval defined by times n−1 and n+1), the AND gate 352 outputs a low logic value at all times associated with the receipt of the data strobe sequence.

System 300 further includes a counter 356 connected to the output of the AND gate 352. The counter 356 increments its value by one in response to receiving a high logic value from the AND gate 352. Accordingly, the counter 356 increments its value by one if the last falling edge of a received data strobe sequence occurs while the 'early' sub-enable window signal produced by the pulse generator 314 is asserted. Portions of the control circuitry 102 may access the value of counter 356 via the output port 360 of the counter 356.

In some embodiments, the control circuitry 102 may adjust one or more of the signals shown in FIG. 2 based on the values of the counters 354 and 356. For example, if the control circuitry 102 determines that more than a predetermined number of data strobe sequences received by system 300 have a last falling edge that occurs when 'early' sub-enable window signal is asserted and/or when the 'late' sub-enable window signal is asserted (i.e., the counter 354 and/or the counter 356 become greater than some predetermined number), the control circuitry 102 may adjust one or more of the signals shown in FIG. 2 as previously described.

Advantageously, the counters 354 and 356 associated with the 'late' and 'early' sub-enable window signals allow the control circuitry 102 to detect whether the last falling edges of received data strobe sequences are drifting out of the close enable window defined by the close enable window signal output by the pulse generator 310. The control circuitry 102 thus is able to take appropriate corrective action, preventing erroneous reading of data provided by the memory 104.

Although a particular configuration of system 300 is shown, other configurations may be implemented without departing from the scope of the present disclosure. For example, elements of system 300 may be removed, the interconnections between elements of system 300 may be changed, and new elements may be added. The system 300 shown in FIG. 3 is merely illustrative, and that any other system implementing one or more of the functionality of the 'early' and/or 'late' sub-enable windows may be designed without departing from the scope of the present disclosure.

Figure 4:
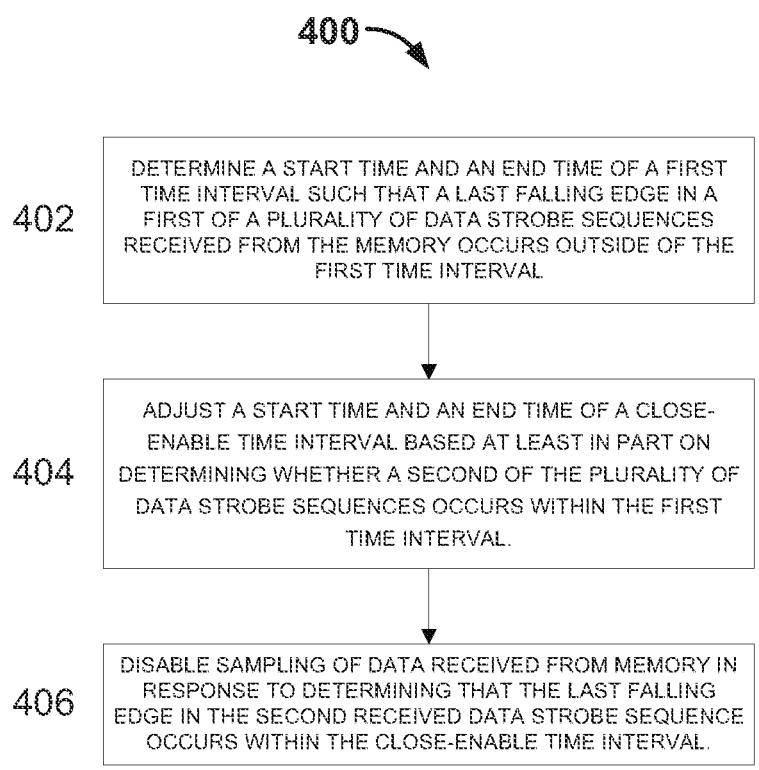
FIG. 4 shows an illustrative flow diagram of an exemplary process for reading data received from memory according to an embodiment of the present disclosure.

FIG. 4 shows an illustrative flow diagram 400 of an exemplary process for reading data received from memory according to an embodiment of the present disclosure.

At 402, a start time and an end time of a first time interval is determined with control circuitry such that a last falling edge in a first of a plurality of data strobe sequences received from the memory occurs outside of the first time interval. For each of the plurality of data strobe sequences, the start time and the end time of the first time interval may be determined relative to an estimated start time of the each of the plurality of data strobe sequences. The plurality of data strobe sequences may be used for sampling the data received from the memory.

At 404, a start time and an end time of a close-enable time interval is adjusted based at least in part on determining whether a second of the plurality of data strobe sequences occurs within the first time interval.

At 406, sampling of data received from the memory is disabled in response to determining that the last falling edge in the second received data strobe sequence occurs within the close-enable time interval.

The foregoing is merely illustrative of the principles of this disclosure and various modifications can be made without departing from the scope of the present disclosure. The above described embodiments of the present disclosure are presented for purposes of illustration and not of limitation, and the present disclosure is limited only by the claims which follow.

What is claimed is:

1. A system for reading data, the system comprising a control circuitry configured to:
    sample data received from a memory using a plurality of data strobe sequences;
    adjust a start time and an end time of a disable time interval based at least in part on determining whether a falling edge in one of the plurality of data strobe sequences occurs within a first time interval; and
    disable the sampling of the data received from the memory in response to determining that the falling edge in the one of the received data strobe sequences occurs within the disable time interval.

2. The system of claim 1, wherein the control circuitry is further configured to determine a start time and an end time of the first time interval such that a falling edge in the one of the plurality of data strobe sequences occurs outside of the first time interval.

3. The system of claim 2, wherein for each of the plurality of data strobe sequences, the start time and the end time of the first time interval are determined relative to an estimated start time of each of the plurality of data strobe sequences.

4. The system of claim 1, wherein the control circuitry is further configured to:
    determine a start time and an end time of a second time interval such that the falling edge in the one of the plurality of data strobe sequences occurs after the end time of the second time interval, wherein:
    for each of the plurality of data strobe sequences, the start time and the end time of the second time interval are determined relative to an estimated start time of each of the plurality of data strobe sequences, and
    adjust the start time and the end time of the disable time interval based at least in part on determining whether the last falling edge in the one of the plurality of data strobe sequences occurs within the second time interval.

5. The system of claim 1, wherein:
    a first of the plurality of data strobe sequence comprises a first sequence of symbols,
    the one of the plurality of data strobe sequences is a second of the plurality of data strobe sequence and comprises a second sequence of symbols, and
    the first sequence of symbols is the same as the second sequence of symbols.

6. The system of claim 1, wherein:
    each of the plurality of data strobe sequences comprises a preamble portion, a plurality of periodic transitions between high and low logic states, and a postamble portion, and
    the data received from the memory is sampled at times corresponding to the plurality of periodic transitions.

7. The system of claim 6, wherein a length of the disable time interval is less than or equal to a period of the periodic transitions.

8. The system of claim 6, wherein:
    a length of the first time interval is less than or equal to one half of a period of the periodic transitions, and
    a center of the first time interval is substantially equal to the end time of the disable interval.

9. The system of claim 1, wherein the control circuitry is further configured to increment a value of a counter in response to the determining that the falling edge in the one of the plurality of data strobe sequences occurs within the first time interval, wherein:
    the adjusting of the start time and the end time of the disable time interval is based at least in part on determining that the value of the counter is greater than a predetermined threshold.

10. The system of claim 1, wherein a start time and an end time of the first time interval are determined based on a position of the disable time interval relative to each of the plurality of data strobe sequences.

11. A method for reading data, the method comprising:
    sampling, with a control circuitry, data received from a memory using a plurality of data strobe sequences;
    adjusting, with the control circuitry, a start time and an end time of a disable time interval based at least in part on determining whether a falling edge in one of the plurality of data strobe sequences occurs within a first time interval; and
    disabling, with the control circuitry, the sampling of the data received from the memory in response to determining that the falling edge in the one of the plurality of data strobe sequence occurs within the disable time interval.

12. The method of claim 11, further comprising:
    determining, with the control circuitry, a start time and an end time of the first time interval, such that a falling edge in the one of the plurality of data strobe sequences occurs outside of the first time interval.

13. The method of claim 12, wherein for each of the plurality of data strobe sequences, the start time and the end time of the first time interval are determined relative to an estimated start time of each of the plurality of data strobe sequences.

14. The method of claim 11, further comprising:
    determining, with the control circuitry, a start time and an end time of a second time interval such that the falling edge in the one of the plurality of data strobe sequences occurs after the end time of the second time interval, wherein:
    for each of the plurality of data strobe sequences, the start time and the end time of the second time interval are determined relative to an estimated start time of each of the plurality of data strobe sequences, and
    adjusting, with the control circuitry, the start time and the end time of the disable time interval based at least in part on determining whether the falling edge in the one of the plurality of data strobe sequences occurs within the second time interval.

15. The method of claim 11, wherein:
a first of the plurality of data strobe sequences comprises a first sequence of symbols,
the one of the plurality of data strobe sequences is a second of the plurality of data strobe sequences and comprises a second sequence of symbols, and
the first sequence of symbols is the same as the second sequence of symbols.

16. The method of claim 11, wherein:
each of the plurality of data strobe sequences comprises a preamble portion, a plurality of periodic transitions between high and low logic states, and a postamble portion, and
the data received from the memory is sampled at times corresponding to the plurality of periodic transitions.

17. The method of claim 16, wherein a length of the disable time interval is less than or equal to a period of the periodic transitions.

18. The method of claim 16, wherein:
a length of the first time interval is less than or equal to one half of a period of the periodic transitions, and
a center of the first time interval is substantially equal to the end time of the disable interval.

19. The method of claim 11 further comprising:
incrementing a value of a counter in response to the determining that the falling edge in the one of the plurality of data strobe sequences occurs within the first time interval, wherein:
the adjusting of the start time and the end time of the disable time interval is based at least in part on determining that the value of the counter is greater than a predetermined threshold.

20. The method of claim 11, wherein a start time and an end time of the first time interval are determined based on a position of the disable time interval relative to each of the plurality of data strobe sequences.

* * * * *